US005774699A

United States Patent [19]
Nagae

[11] Patent Number: 5,774,699
[45] Date of Patent: Jun. 30, 1998

[54] SYSTEM CONTROLLER FOR CONTROLLING SWITCHING OPERATIONS OF VARIOUS OPERATION CLOCKS FOR CPU, DRAM, AND THE LIKE

[75] Inventor: Akihito Nagae, Tokyo, Japan

[73] Assignee: Kabushiki Kaisha Toshiba, Kawasaki, Japan

[21] Appl. No.: 594,336

[22] Filed: Jan. 30, 1996

[30] Foreign Application Priority Data

Jul. 4, 1995 [JP] Japan .................................. 7-168837

[51] Int. Cl.⁶ ....................................................... G06F 1/04
[52] U.S. Cl. ........................... 395/551; 395/552; 395/555; 395/558
[58] Field of Search ................................ 395/551, 552, 395/555, 558

[56] References Cited

U.S. PATENT DOCUMENTS 4,931,986  6/1990  Daniel et al. ........................... 364/900
5,118,975  6/1992  Hillis et al. ............................. 307/602
5,446,867  8/1995  Young et al. ........................... 395/550

FOREIGN PATENT DOCUMENTS 64-58007   3/1989  Japan ................................. G06F 1/04
6-282350  10/1994  Japan ................................. G06F 1/10

Primary Examiner—Dennis M. Butler
Attorney, Agent, or Firm—Finnegan, Henderson, Farabow, Garrett & Dunner, L.L.P.

[57] ABSTRACT

In a controller which generates a clock to be output to a CPU on the basis of a fundamental clock, and incorporates control logic circuits such as DRAM control, CPU cycle control, and the like, the internal operation clock is switched to either an internally generated clock or a clock obtained by re-inputting a clock which is temporarily output to an external circuit. Only the clock to be output to the CPU can be delayed with respect to the clock used for generating a DRAM control signal, and the delay time of the DRAM control signal with respect to the CPU clock can be minimized.

15 Claims, 10 Drawing Sheets

CLK

SIG

OUTPUT SIGNAL

10ns

CAS#

DELAY

DRAM DATA

15ns

BRDY#

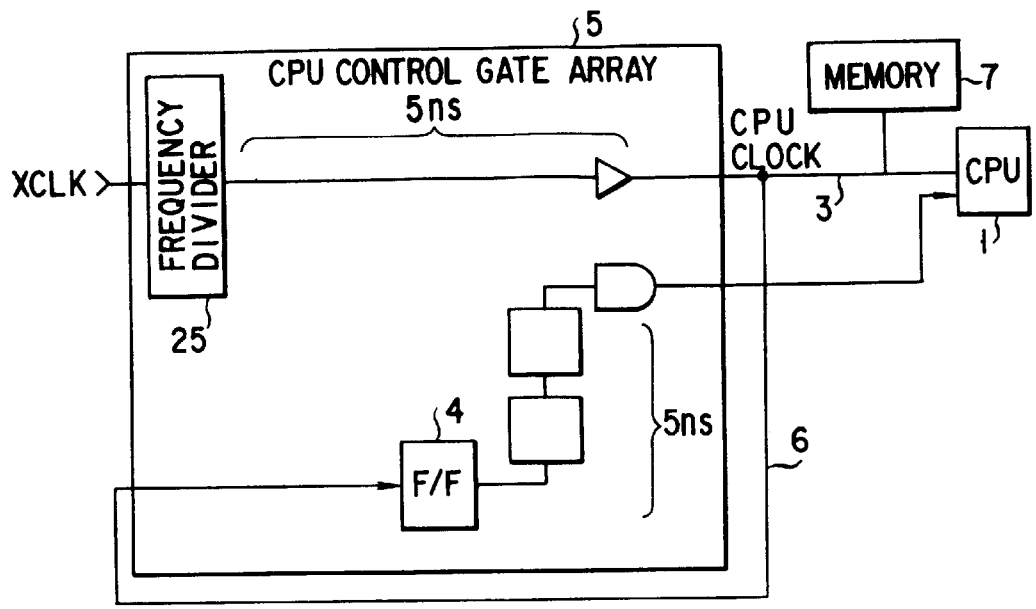
F I G. 2
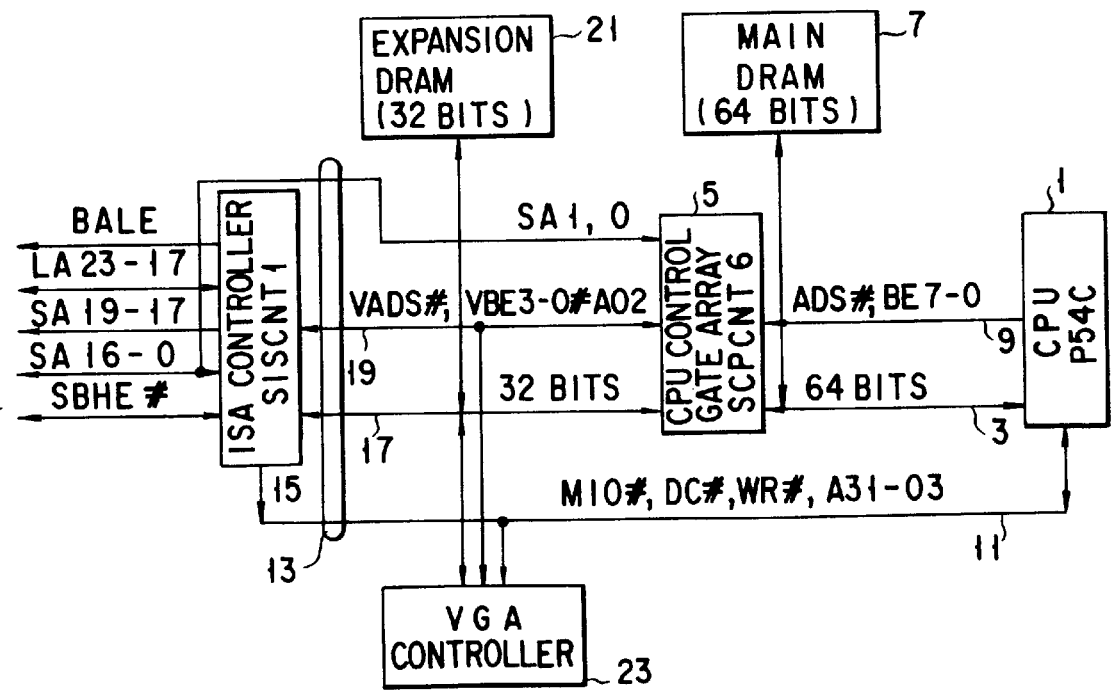
F I G. 4

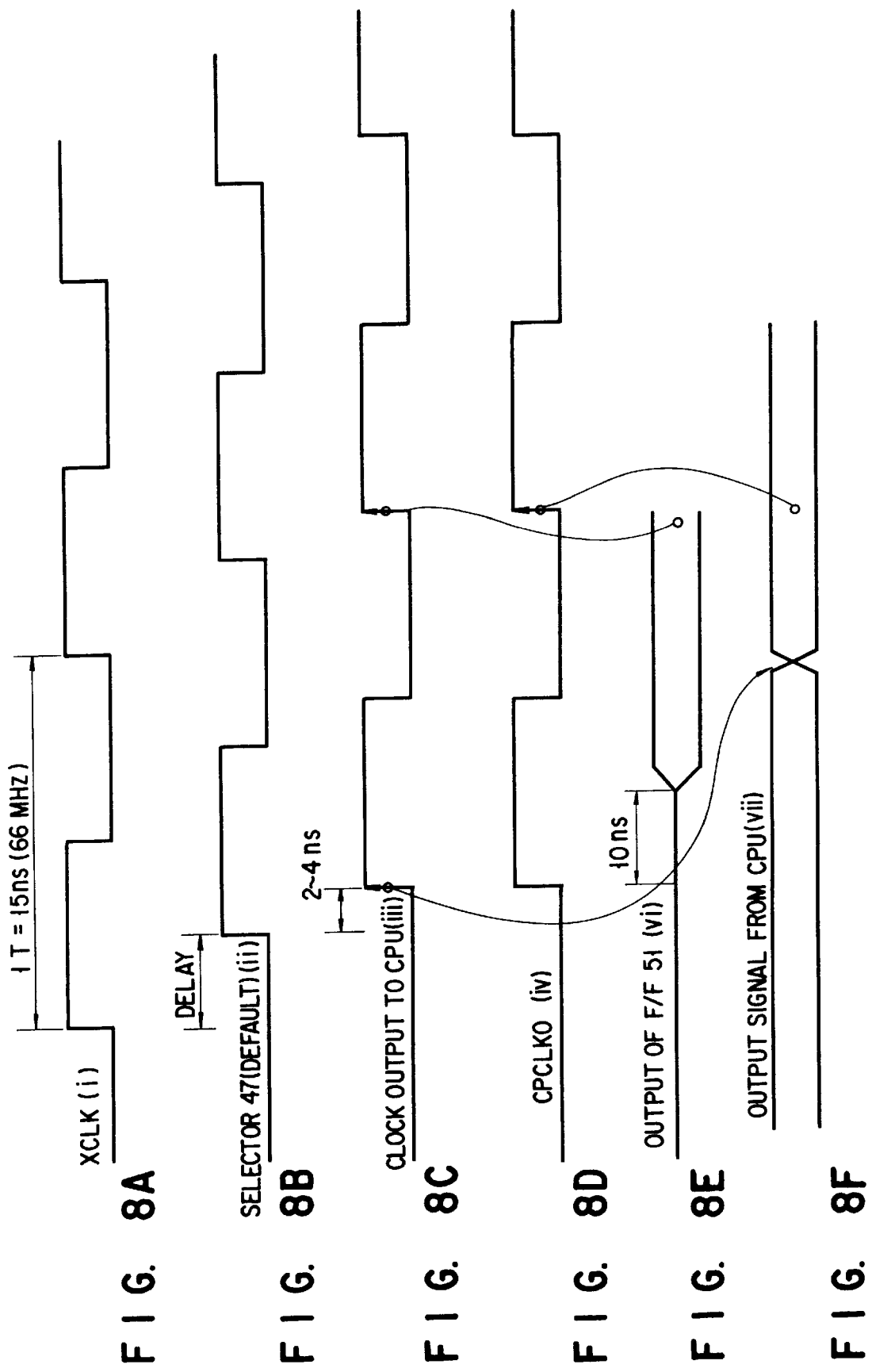

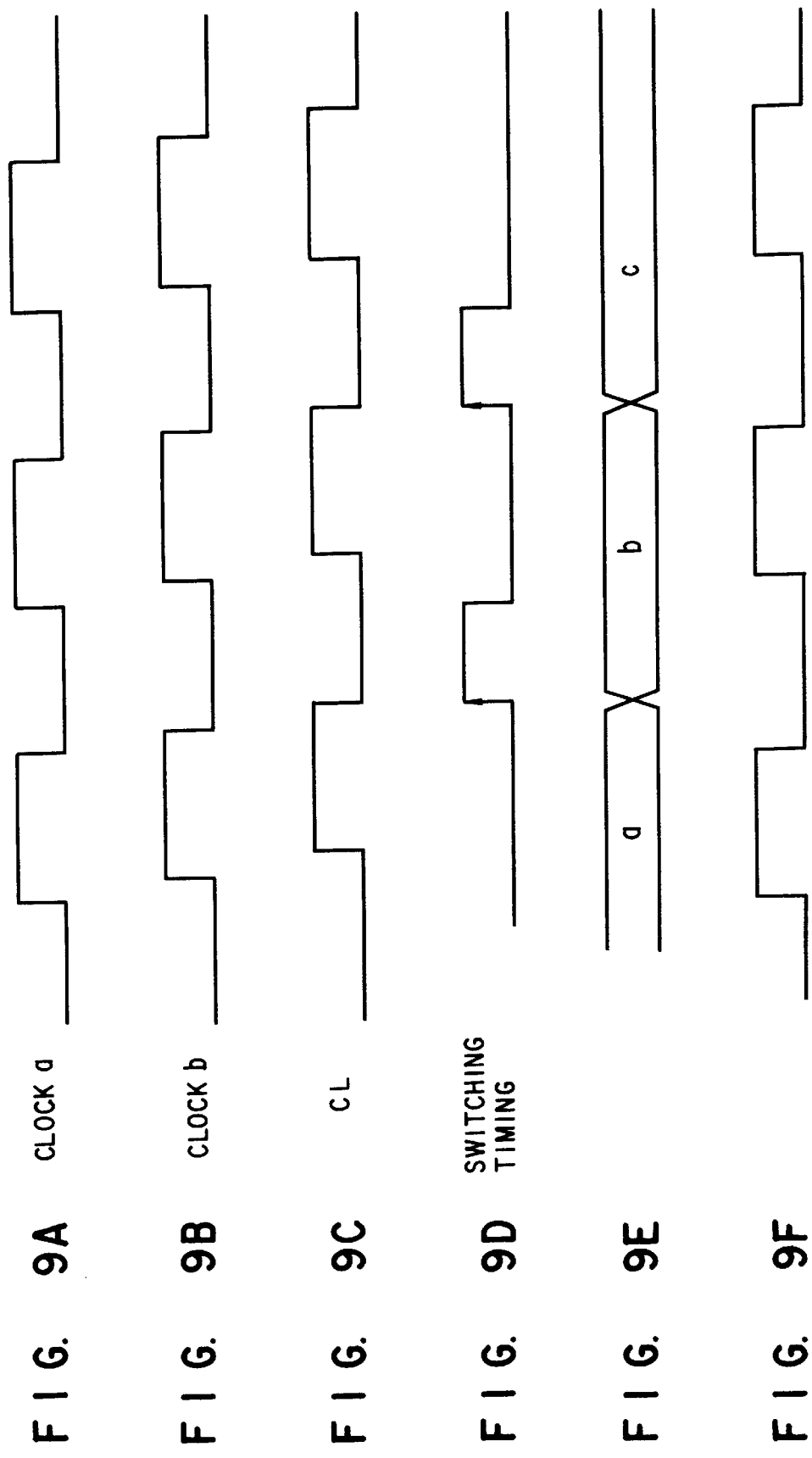

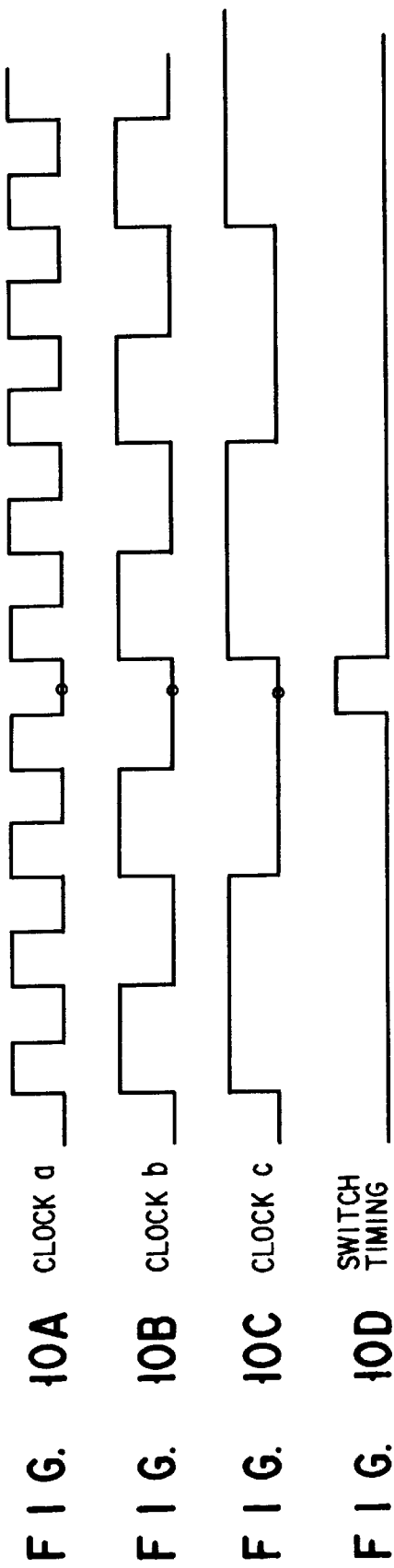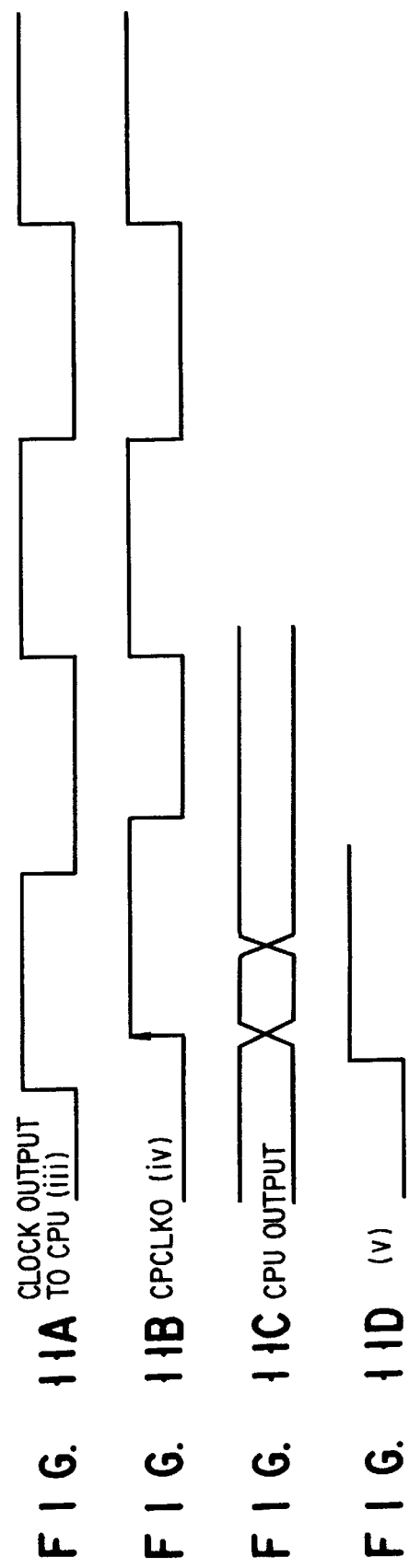

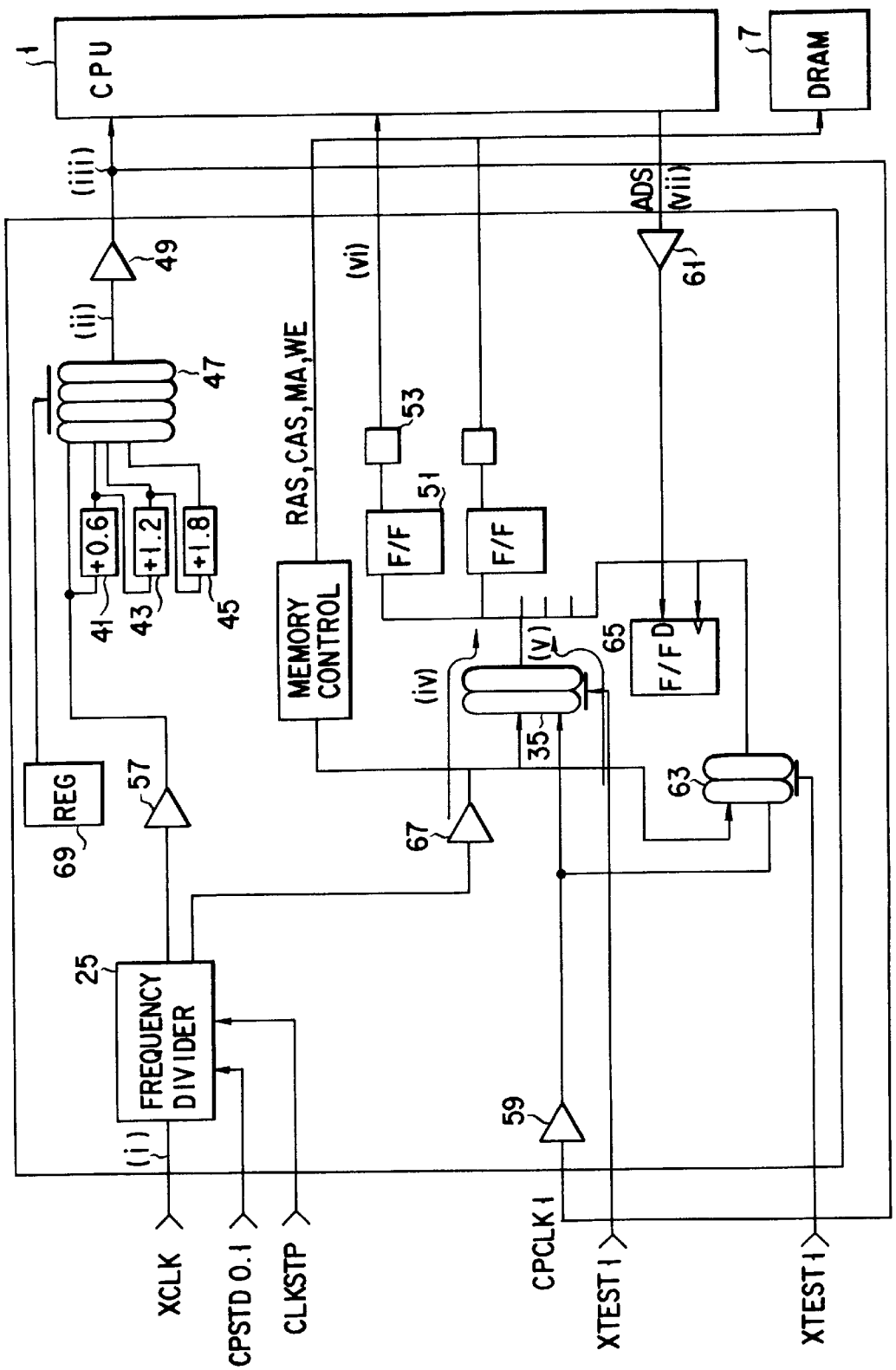
F I G. 13

SYSTEM CONTROLLER FOR CONTROLLING SWITCHING OPERATIONS OF VARIOUS OPERATION CLOCKS FOR CPU, DRAM, AND THE LIKE

BACKGROUND OF THE INVENTION

1. Field of the Invention

The present invention relates to a clock control system and, more particularly, to a system controller which generates a clock output to a CPU on the basis of a fundamental clock, and incorporates control logic circuits such as DRAM control, CPU cycle control, and the like, wherein the system controller can switch the internal operation clock to either an internally generated clock or a clock obtained by re-inputting a clock which is temporarily externally output, and controls the switching operations of various operation clocks for a CPU, DRAM, and the like.

2. Description of the Related Art

In recent years, various notebook or laptop type portable computers, which are portable and can be driven by batteries, have been developed.

On the other hand, the processing speed of a CPU (central processing unit) is increasing year by year. For example, CPUs available from Intel Corp. (U.S.A.) have evolved from the 80286 into the 80386, 80486, Pentium, . . . while increasing their processing speeds, thus attaining a high internal clock speed of the CPU and a large CPU bus width.

Some of these computers include a CPU controller gate array constituting a CPU clock generator for generating CPU clocks on the basis of a fundamental clock (XCLK), a DRAM controller, a CPU cycle controller, and the like. In this case, various signals such as DRAM control signals and CPU control signals are sampled or generated with reference to clock signal. When the CPU outputs a given signal to the CPU control gate array, the output signal is synchronized with the clock signal of the CPU. However, when the CPU control gate array receives a signal output from the CPU, it receives the signal by using a clock signal for operating circuits within the CPU control gate array. For this reason, the circuits within the CPU control gate array may generate operation errors due to out of phase between the clock signal for operating the circuits within the CPU control gate array and the CPU clock signal.

SUMMARY OF THE INVENTION

An object of the present invention is to provide a system controller which outputs a CPU clock as well as re-inputs the CPU clock in order to operate the circuits within the system controller by using a clock which is in phase with the CPU clock.

Another object of the present invention is to provide a system controller for controlling a clock switching operation, which controller circumvents the difficulty of skew adjustment and allows high-speed accesses to a DRAM by allowing the use of different clocks as a clock used for generating a signal to be output from a CPU controller to a CPU, DRAM, or the like, and a clock used for sampling an input signal from the CPU.

In order to achieve the above object, according to a first aspect of the present invention, a computer system comprises: a central processing unit (CPU); means for generating basic clock signals; CPU clock generating means for generating, based on the basic clock signals, CPU clock signals to be output to the CPU; delay means for delaying the CPU clock signals output from the CPU clock generating means; means for generating a selection signal; means for selecting the CPU clock signals output from the CPU clock generating means and the CPU clock signals output from the delay means in accordance with the selection signal from the selection signal generating means; and means for outputting the CPU clock signals output from the selecting means to the CPU.

According to a second aspect of the present invention, a computer system comprises: a central processing unit (CPU); a memory circuit; a system controller for controlling the CPU; first clock generating means for generating basic clock signals; second clock generating means for generating CPU clock signals and clock signals for generating signals of each circuit within the system controller in accordance with the basic clock signals; means for outputting, from the system controller to the CPU, the CPU clock signals generated by the CPU clock generating means; means for feeding back the CPU clock signals output to the CPU to the system controller; means, when a signal is to be output from the system controller to the memory circuit, for outputting the signal to the memory circuit, in synchronism with the clock signals for generating the signals of each circuit within the system controller; and means, when a signal is to be output from the system controller to the CPU and/or when the system controller samples the signals output from the CPU, for operating each circuit within the system controller by using the fed-back CPU clock signals.

According to a third aspect of the present invention, a computer system comprises: a central processing unit (CPU); a system controller for controlling the CPU; first clock generating means for generating basic clock signals; second clock generating means for generating CPU clock signals to be output to the CPU and clock signals for generating signals of each circuit within the system controller, in accordance with the basic clock signals; means for outputting, from the system controller to the CPU, the CPU clock signals generated by the second clock generating means; means for feeding back to the system controller the CPU clock signals output to the CPU; means for generating a selection signal; and means for inputting the clock signals for generating signals of each circuit within the system controller and the fed-back CPU clock signals, and for, when the each circuit within the system controller is to be operated, outputting, in accordance with the selection signal from the selection signal generating means, the clock signals for generating signals of each circuit within the system controller or the fed-back CPU clock signals, as the clock signals for generating signals of each circuit within the system controller.

According to a fourth aspect of the present invention, a computer system comprises: a central processing unit (CPU); a memory circuit; a system controller for controlling the CPU; first clock generating means for generating basic clock signals; second clock generating means for generating CPU clock signals output to the CPU and clock signals for generating signals of each circuit within the system controller, in accordance with the basic clock signals; means for outputting the CPU clock signals generated by the second clock generating means from the system controller to the CPU; means for feeding back the CPU clock signals output to the CPU to the system controller; means, when a signal is to be output to the memory circuit from the system controller, for outputting the signal to the memory circuit in synchronism with the clock signals for generating signals of each circuit within the system controller; and means for inputting the clock signals for generating signals of each circuit within the system controller output from the second clock generating means and the fed-back CPU clock signals when a signal output from the CPU is sampled, and for selecting the clock signals for generating signals of each circuit within the system controller when the signal to be output to the CPU is to be generated.

According to a fifth aspect of the present invention, a computer system comprises: a central processing unit (CPU); a memory circuit; a system controller for controlling the CPU; means for generating basic clock signals; clock generating means for generating CPU clock signals to be output to the CPU and clock signals for generating signals to be output to the memory circuit, in accordance with the basic clock signals; and means for delaying the CPU clock signals to be output to the CPU with respect to the clock signals for generating signals to be output to the memory circuit.

According to the present invention, a controller which generates a clock output to a CPU on the basis of a fundamental clock and incorporates control logic circuits such as DRAM control, CPU cycle control, and the like can switch the internal operation clock to either an internally generated clock or a clock obtained by re-inputting a clock which is temporarily externally output.

Input and output signals use different clocks. More specifically, the clock used for generating a signal to be output to a CPU, DRAM, or the like, and the clock used for sampling an input signal from the CPU can use different clocks. More specifically, a signal to be output to the CPU, DRAM, or the like can use an internally generated clock, and an input signal can use a clock (CPU clock) which is temporarily externally output and is re-input.

Also, the clock to be output to the CPU and the clock used for generating a DRAM control signal can use different clocks. More specifically, only the clock to be output to the CPU can be delayed with respect to the clock used for generating the DRAM control signal, and the delay time of the DRAM control signal with respect to the CPU clock can be shortened.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention

FIG. 2 is a block diagram for explaining skew adjustment in a CPU control gate array;

FIG. 4 is a block diagram showing an embodiment of a computer to which a system controller for controlling a clock switching operation according to the present invention is applied;

FIGS. 8A through 8F are timing charts of the respective signals shown in FIG. 7;

FIGS. 9A through 9F are timing charts for explaining the timings for programmably switching clocks;

FIGS. 10A through 10D are timing charts for explaining the timings for dynamically switching the CPU clocks;

FIGS. 11A through 11D are timing charts for explaining the reason why a CPU clock output from the CPU control gate array is re-input to the CPU control gate array;

FIG. 13 is a block diagram showing the second modification of the embodiment shown in FIG. 7.

DETAILED DESCRIPTION OF THE PREFERRED EMBODIMENTS

The preferred embodiment of the present invention will be described hereinafter with reference to the accompanying drawings.

Figures 1, 3A, 3B, 3C, 3D, 3E, 3F:
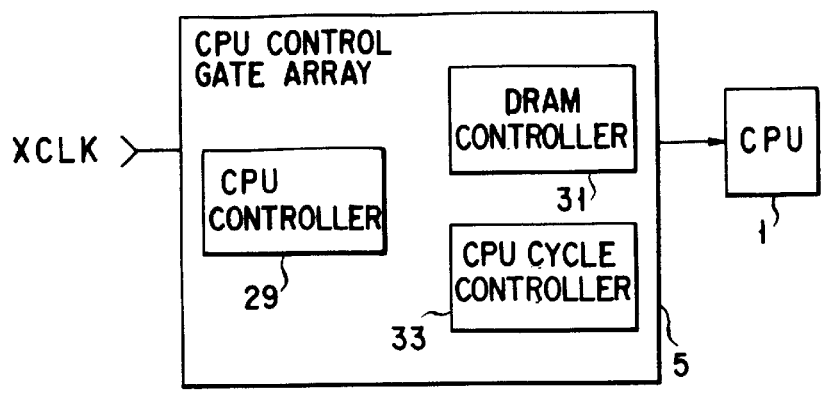
FIG. 1 is a block diagram showing an embodiment of a system controller according to the present invention.
FIGS. 3A through 3F are timing charts for explaining the timings of a fundamental clock signal and various signals.

FIG. 1 is a block diagram showing an embodiment of a CPU control gate array 5 as the system controller according to the present invention.

In FIG. 1, the CPU control gate array 5 comprises a CPU controller 29 including a CPU clock generating circuit in accordance with a fundamental clock signal (XCLK), a DRAM controller, a CPU cycle controller, and the like.

FIG. 2 is a block diagram showing an example of operating circuits within the CPU control gate array 5 by using a clock signal which is in phase with the CPU clock signal output from the CPU control gate array 5. As shown in FIG. 2, the CPU clock signal is output from the CPU control gate array 5 to the CPU 1 as well as re-input to the CPU control gate array 5 through a feed-back line 6. As a result, each circuit within the CPU control gate array can be operated by using the clock signal which is in phase with the CPU clock signal.

On the other hand, when a signal is output from the CPU control gate array to the CPU 1, the CPU 1 receives the signal in synchronism with the CPU clock signal. In this case, predetermined setup time and hold time must be assured for the output signal.

Assume that the skew (a time delay between any two electrical signals) between a clock output from a CPU controller 5 shown in FIG. 2 to a CPU 1 and a clock obtained by feeding back the clock output from the CPU controller 5 is zero. In the CPU controller 5, the internal operation clocks are distributed to respective circuits. Assume that the feed-back CPU clock signal requires 5 ns until it reaches a flip-flop (F/F) 4. Furthermore, assume that the CPU clock signal requires another 5 ns until it reaches the output of the CPU controller 5 via various circuits. In this case, a skew of a total of 10 ns is generated. As a result, as shown in FIG. 3C, the output signal is delayed by 10 ns. In this case, if the F/F 4 is operated by a clock in phase with the CPU clock, only a delay time (5 ns) on the output side is required. Therefore, when the circuits are designed so that the CPU clock output from a frequency divider 25 requires 5 ns until it reaches the output of the CPU controller 5, the skew between the CPU clock and the output signal from the F/F 4 should theoretically becomes zero. Then, a signal can be output with a minimum delay time.

Further, the memory timing poses a problem. A memory 7 is directly connected to a CPU bus 3. In this case, when the CPU fetches data output from the memory, the data must be synchronized with the CPU clock. Assume that a signal CAS (Column Address Strobe) # (# means active low) is output, as shown in FIG. 3D, DRAM DATA is output, as shown in FIG. 3E, and a signal Burst Ready (BRDY#) (the signal BRDY# indicates that a device addressed in response to a read command outputs data onto a data bus or receives data from a processor in response to a write command) is output, as shown in FIG. 3F.

In this case, the CPU samples the DRAM DATA with a clock sampled when the signal BRDY# is at low level. The delay time of the signal CAS# shown in FIG. 3D influences a data access. Theoretically, as the signal CAS# shown in FIG. 3D has a shorter delay time, the data access time is shortened. In view of this, if circuits from the frequency divider 25 to the F/F 4 shown in FIG. 2 are driven using a high speed clock signal (e.g., 1 ns), the delay time of a signal output from the CPU controller becomes 1 ns. Therefore, the delay time of the signal CAS# shown in FIG. 3D becomes 1 ns.

As described above, when the CPU control gate array receives the signal output from the CPU 1, it is preferable to use a clock signal which is in phase with the CPU clock signal.

On the other hand, in order to access the DRAM at high speed, it is preferable to use a clock signal higher than the CPU clock, which is generated within the CPU control gate array 5.

An embodiment will now be described in which the internal operation clock signal of the CPU control gate array can be switched to one of the re-input CPU clock and the internally generated high-speed clock signal.

FIG. 4 is a block diagram showing an embodiment of a computer to which a system controller for controlling a clock switching operation according to the present invention is applied. As shown in FIG. 4, a CPU 1 adopts the Pentium (P54C) processor available from Intel Corp. (U.S.A). The CPU 1 is connected to a CPU control gate array 5 via a 64-bit data bus 3. The data bus 3 is connected to a 64-bit main DRAM 7. Furthermore, the CPU 1 and the CPU control gate array 5 are connected to each other via a control bus 9.

The control bus 9 supplies signals ADS# and BE7-0 to the CPU control gate array 5. The signal ADS# is a signal indicating the start of a bus cycle. At the beginning of the bus cycle, the CPU 1 outputs an address to a common bus 11 (to be described later) and outputs bus cycle definition information to the control bus 9 during the period of "address time (T1)". Furthermore, the CPU 1 activates a signal ADS (Address Strobe) # to indicate that a correct address and bus cycle definition information are on the bus. Note that # indicates that the signal is active low. The data bus 3 and the control bus 9 constitute a CPU bus.

The CPU control gate array 5 is constituted by a data bus drive block, a CPU control block, a DRAM mapper, a DRAM control block, and a CPU cycle check block. In addition, the gate array 5 is provided with a selector for register data from the above-mentioned blocks, a delay control circuit for the signal ADS#, a delay control circuit for a clock to be output to the CPU, a clock/reset/suspend control circuit, an additional circuit for test, and the like. The CPU control gate array 5 is connected to an ISA controller 15 for controlling an ISA bus via a VL bus 13. The VL bus 13 is constituted by a 32-bit data bus 17, a control bus 19, and the like. The 32-bit data bus 17 is connected to a 32-bit expansion DRAM 21. The control bus 19 transfers signals VADS# (the signal ADS# on the VL bus), VBE3-0, A02, and the like. The signal VADS# is obtained by converting the signal ADS# output from the CPU 1 into a signal compatible with the VL bus by the CPU control gate array 5. Furthermore, the gate array 5 generates the signals VBE3-0# and A02 for the VL bus on the basis of the signals BE7-0# output from the CPU 1. The conversion method will be described in detail later.

The common bus 11 is used for commonly using the CPU bus and the VL bus, i.e., for commonly transferring address data A31-03, and signals MIO#, DC#, and WR# between the CPU bus and VL bus. As described above, when the CPU comprises the Pentium processor, the data bus width is 64 bits. For this reason, addressing is made in units of 64 bits (in units of 8 bytes). Therefore, since the lower 3 bits (i.e., bits 0 to 2) are not necessary, the address data A31-03 are output onto the common bus 11. The signal MIO# is a signal indicating a memory address or I/O address. When the signal MIO# is at high level, the CPU 1 outputs a memory address; when the signal MIO# is at low level, the CPU 1 outputs an I/O address. The signal DC# is a signal indicating data and control data. When the signal DC# is at high level, it means data; when the signal DC# is at low level, it means control data. Furthermore, the signal WR# means "write" when it is at high level, and means "read" when it is at low level.

A VGA controller 23 is a VGA standard display controller, and is connected to the common bus 11 and the control bus 19. The common bus 11 is used for exchanging the address data A31-03 and various signals MIO#, DC#, and WR# among the CPU 1, the ISA controller 15, and the VGA controller 23.

Figure 5:
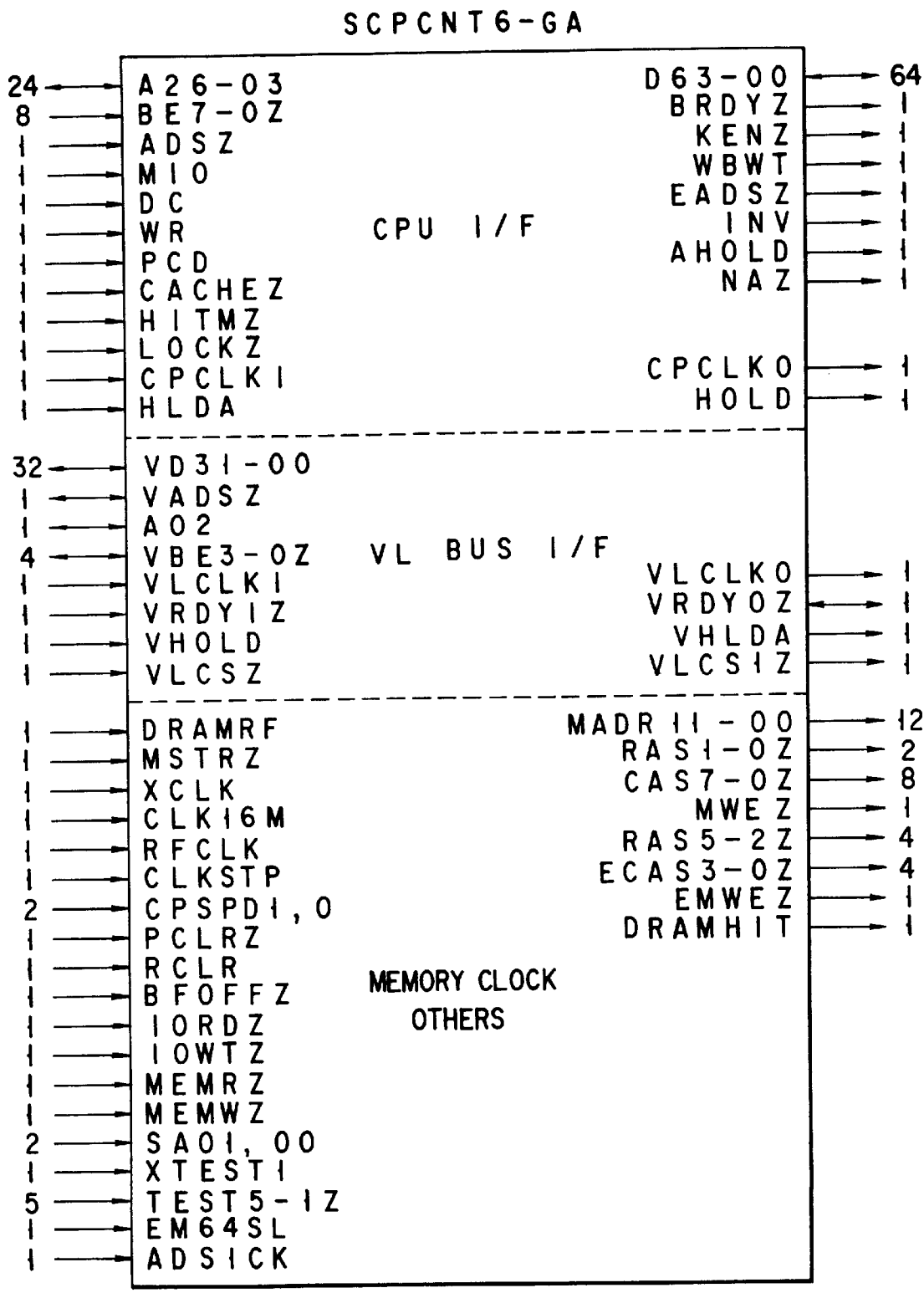
FIG. 5 is a view showing input/output signals of a gate array shown in FIG. 4.

FIG. 5 is a view showing input/output signals of the gate array shown in FIG. 4. The functions of these signals are as follows.

| (I) CPU Interface | | |
|---|---|---|
| Signal Name | I/O | Function |
| D63-00 | I/O | CPU data bus |
| A26-A03 | I/O | CPU address bus |
| BE7-0Z | I | CPU byte enable |
| CPCLKO | O | clock output for CPU |
| CPCLKI | I | to loop back CPCLKO; used in timing adjustment |
| ADSZ | I | address status for CPU |
| MIO | I | memory/IO for CPU |
| DC | I | data/command for CPU |
| WR | I | write/read for CPU |
| BRDYZ | O | ready |
| PCD | I | page cache disable |
| KENZ | O | cache enable |
| WBWT | O | write back/write through |
| CACHEZ | I | cache cycle |
| HITMZ | I | hit to cache change line |
| LOCKZ | I | lock cycle |
| EADSZ | O | external address status |
| INV | O | cache invalid |
| HOLD | O | hold request to CPU |
| HLDA | I | hold permission from CPU |
| AHOLD | O | address hold request to CPU |
| NAZ | O | next address |
| (II) VL Bus Interface | | |
| VD31-00 | I/O | VL bus data |
| VADSZ | I/O | VL bus address status |
| A02 | I/O | A2 |
| VBE3-0Z | I/O | VL bus byte enable |
| VLCLKO | O | VL bus clock output; obtained by frequency dividing CPCLK with 2 |

-continued

| Signal | I/O | Function |
|---|---|---|
| VLCKLI | I | VL bus clock input; used for performing timing adjustment by inputting VLCLKO |
| VRDYIZ | I | VL bus ready input |
| VDRYOZ | I/O | VL bus ready output |
| VLCSZ | I | device select from VGA chip |
| VLCSIZ | O | VL device select; output when DRAM hit has occurred during hold cycle |
| VHOLD | I | VL bus hold request |
| VHLDA | O | VL bus hold permission |
| (III) Memory (DRAM) Interface | | |
| MADR11-00 | O | DRAM address |
| RAS1-0Z | O | RAS for internal DRAM |
| CAS7-0Z | O | CAS for internal DRAM |
| MWEZ | O | write enable for internal DRAM |
| RAS5-2Z | O | RAS for expansion DRAM |
| ECAS3-0Z | O | CAS for expansion DRAM |
| EMWEZ | O | write enable for expansion DRAM |
| (IV) Memory (SISCNT) Interface | | |
| DRAMRF | I | shadow refresh request |
| DRAMHIT | O | to indicate that CPU access hits DRAM |
| (V) Clock | | |
| XCLK | I | clock input (for CPU clock) |
| CLK16M | I | 16-MHz clock input (clock for, e.g., counter) |
| RFCLK | I | 32-KHz clock input (e.g., backup refresh) |
| CPCLKO | | see item of CPU interface |
| CPCLKI | | see item of CPU interface |
| VLCLKO | | see item of VL bus interface |
| VLCLKI | | see item of VL bus interface |
| (VI) Clock Control | | |
| CPSPD1,0 | I | clock switching signal for CPU |
| (VII) Reset | | |
| PCLRZ | I | P-ON clear (output only when backup power supply + reset SW are used) |
| RCLR | I | resume clear (output only when resume P-ON) |
| (VIII) Resume | | |
| BFOFFZ | I | buffer OFF |
| (IX) ISA BUS | | |
| IORDZ | I | for IO read internal register access |
| IOWTZ | I | for IO write internal register access |
| SA01,00 | I | for internal register access in IO cycle |
| MEMRZ | I | memory read; for ISA memory read command |
| MEMWZ | I | memory write; for ISA memory write command |
| MSTRZ | I | external master signal |
| (X) Test Pin | | |
| TEST3-1Z | I | TEST mode |
| (XI) Others | | |
| ADSICK | I | control of ADS# width; 1 = 1CLK, 0 = 1.5CLK. |

The signal ADSICK is used so that the signal ADS# can always be sampled upon P-ON. After the system is set up, the ADS# width is restored using a P-xx8F (index: FEh) register. This signal is latched when the signal PCLR# is canceled.

Expansion memory type switching 1 = 64 bits;

| Signal | I/O | Function |
|---|---|---|
| 0 = bits | | |
| EM64SL | I | expansion memory type switching; 1 = 64 bit, 0 = 32 bits |
| TEST5-4 | I | the delay time of the clock output (CPCLKO) to the CPU is switched using these two signals |

| TEST5Z | TEST4Z | Delay Value |
|---|---|---|
| 0 | 0 | default value |
| 0 | 1 | default value + 0.6 ns delay |
| 1 | 0 | default value + 1.2 ns delay |
| 1 | 1 | default value + 1.8 ns delay |
| XTESTI | I | signal used for selecting whether CPCLKX to be supplied to respective blocks is generated based on internal clock (CPCLKO0) or clock (CPCLKI1) returned from external pin |

When XTESTI = 0, CPCLKI1
When XTESTI = 1, CPCLKO0

Figure 6:
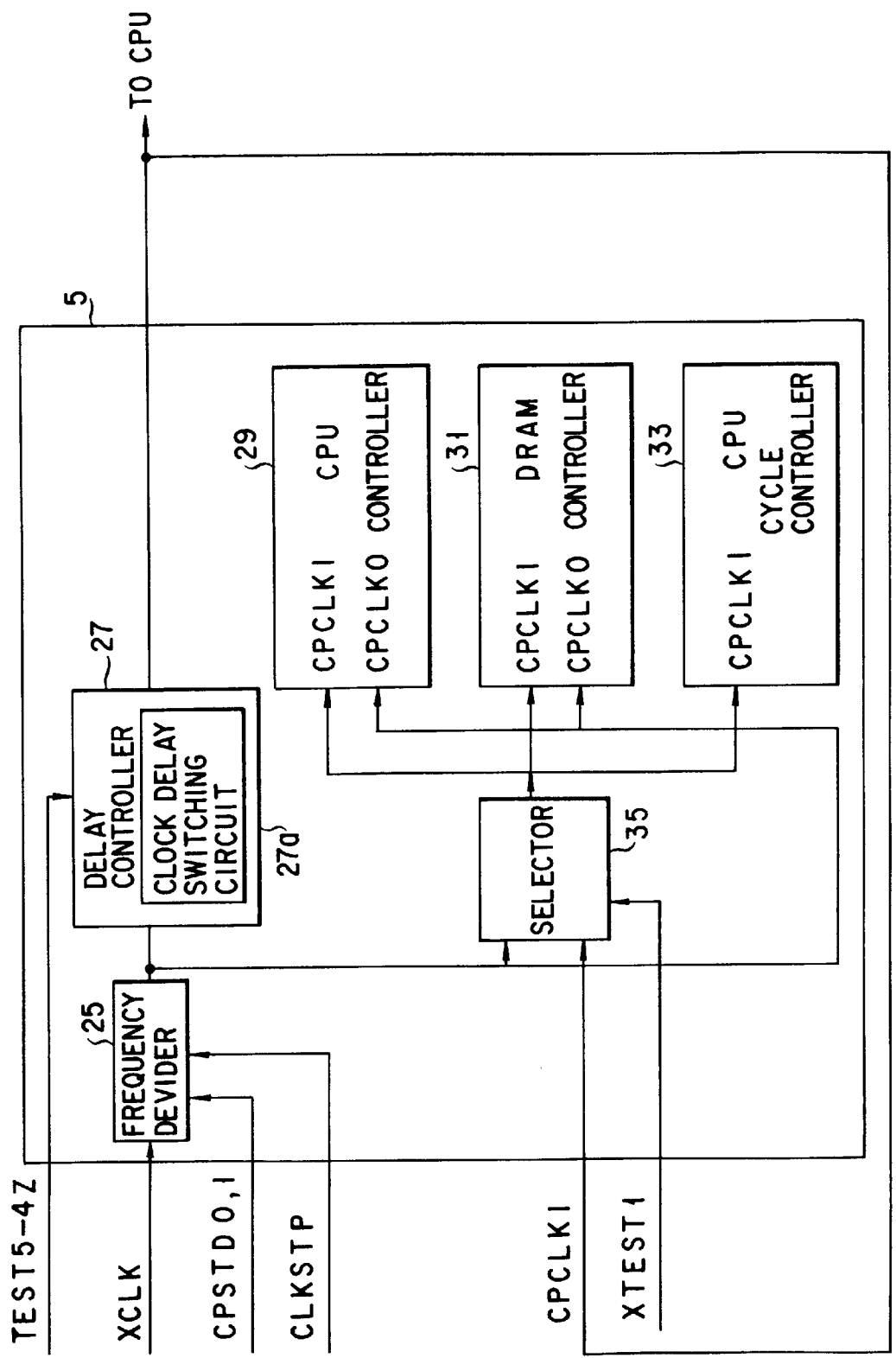
FIG. 6 is a detailed block diagram of a CPU control gate ray shown in FIG. 4.

FIG. 6 is a detailed block diagram of the CPU control gate array 5 shown in FIG. 4.

A frequency divider 25 is a circuit for frequency-dividing a fundamental clock signal (XCLK) with n (n=1, 2, 4, 8). The frequency divider 25 receives CPU clock switching signals (CPSTDO,1) and a clock stop signal (CLKSTP). The clock switching signals (CPSTDO,1) are signals for setting n for frequency division. When the clock stop signal (CLKSTP) is input, the frequency divider 25 stops generation of clocks. A clock signal output from the frequency divider 25 is input to a delay controller 27. The delay controller 27 has a clock delay switching circuit 27a, and changes the delay amount in response to externally supplied delay switching signals (TEST5-4Z).

The relationship between the delay switching signals and the delay amount is as follows.

| TEST5Z | TEST4Z | Delay Value |
|---|---|---|
| 0 | 0 | default value |
| 0 | 1 | default value + 0.6 ns delay |
| 1 | 0 | default value + 1.2 ns delay |
| 1 | 1 | default value + 1.8 ns delay |

A clock signal (CPCLKO) output from the delay controller 27 is output to the CPU, and is also input to the CPU control gate array 5 as a loop back signal (CPCLKI). The CPU controller gate array 5 includes a CPU controller 29, a DRAM controller 31, and a CPU cycle controller 33.

The CPU controller 29 is a block for controlling the CPU 1, and input/output signals and their functions of this block are as follows.

| Signal Name | I/O | Function |
|---|---|---|
| A26-03 | I | CPU addresses 26-03; for decoding memory area |
| A02I | I | A02 upon DMA/master; output from SISCNTI |
| A02O | O | A02 for CPU address; generated based on BE7IZ-0IZ from CPU; not output upon DMA/master |

| Signal Name | I/O | Function |
|---|---|---|
| BE7Z-0Z | I | byte enable signal of CPU |
| ADSZ | I | address status signal of CPU |
| MEMWZ | I | memory write signal for ISA bus |
| MIOJ | I | status signal of CPU; status signal upon DMA/master |
| WR | I | status signal of CPU; status signal upon DMA/master |
| BRDYZ | O | obtained by outputting ready signal, output from SISCNTI, in synchronism with CPU clock |
| HOLD | O | bus hold request signal to be output to CPU |
| HLDA | I | bus hold acknowledge signal from CPU; receives signal from DRAMCNT |
| HITMZ | I | cache change line hit output from CPU |
| EADSZ | O | used in inquire cycle |
| INV | O | signal for invalidating cache when inquire cycle hit has occurred |
| VLCLKI | I | clock for VL bus; used as synchronization signal for, e.g., signal ADSN |
| VBE30Z-00Z | O | byte enable signal for VL bus; generated by decoding BE7Z-01Z |
| VADSOZ | O | output ADSZ from CPU onto VL bus in synchronism with 25-MHz clock |
| VADSIZ | I | signal ADSN from DMA/external master; generate and output signals BE7#-BE0# to DRAMCONT when this signal is active-output from SISCNT while signal HLDA is H |
| VRDYIZ | I | ready signal for VL bus; used for generating signal ADSN in 32 bits × 2 cycle |
| VHOLD | I | HOLD signal for VL bus; output to CPU in synchronism with CPU clock |
| VHLDA | O | signal obtained by logically ANDing signal HLDA from CPU and signal VHOLDA from DRAMCNT |
| VLCSIZ | I | signal for notifying that device on VL bus is selected |
| VLCSOZ | O | used in inquire cycle |
| VRDYOIZ | I | used for generating CPU ready signal upon VGA access |
| VRDYOOZ | O | signal VRDYOZ on VL bus |
| DLAT | O | data latch signal of D63-I-001 |
| DSEL1 | O | signal for data swap |
| DSEL2 | O | signal for data swap |
| RDLAT3 | O | register data latch signal |
| RDLAT2 | O | register data latch signal |
| RDLAT1 | O | register data latch signal |
| RDLAT0 | O | register data latch signal |
| VSEL3 | O | signal for selecting VL bus data and internal register data |
| VSEL2 | O | signal for selecting VL bus data and internal register data |
| VSEL1 | O | signal for selecting VL bus data and internal register data |
| VSEL0 | O | signal for selecting VL bus data and internal register data |
| VDIAT1 | O | used for latching data to be output to D63-32 in VL bus cycle |
| VDIAT0 | O | used for latching data to be output to D63-32 in VL bus cycle |
| ARA63S-48S | O | address decode signal for respective areas in 000C0000II-000FFFFFII period |
| CNVMES | O | address decode signal of 00000000II-0009FFFFII |
| EXTMS | O | address decode signal of Extended Memory area |
| SMRAM3S-0S | O | address decode signal for respective areas obtained by dividing SM-RAM area of FFFE0000II-FFFEFFFFII in units of 16 KB |
| DRAMCYC | O | signal indicating DRAM cycle by CPU address decode |
| DRMWP | O | signal indicating that DRAM area accessed by CPU address decode is write-protect designated area |
| DRAMKNZ | O | signal indicating whether DRAM area accessed by CPU address decode is cache area or not |
| DRAMWB | O | signal indicating that DRAM area accessed by CPU address decode is write-back designated area |
| AHOLD | I | address hold signal |
| D64HIT | I | internal 64-bit DRAM HIT signal |
| VHOLDA | I | used for connecting signal VHLDA from DRAM control block |
| ARADEF | O | signal indicating different setting states of accessed areas, e.g., DRAM upon reading, and ISA upon writing |
| SA01-00 | I | address signal of ISA bus |
| IORDZ | I | signal IORD for ISA bus |
| IOWTZ | I | signal IOWR for ISA bus |
| MEMRZ | I | signal MEMRZ for ISA bus |
| MSTRZ | I | signal STRZ for ISA bus |
| SD071-001 | I | SD signal for ISA bus |
| DENZ | O | output enable signal of D63-00 |
| VDENZ | O | output enable signal of VLD31-00 |
| REGD07-00 | O | register read data |
| REGSL | O | output enable for internal specific register read-out data |
| REGSLOR | I | register read select signal |
| LAD26-03 | O | signal obtained by latching A26-03 at leading edge of signal ADSN |
| CPCLKO | I | CPU clock signal |
| CPCLKI | I | signal obtained by re-inputting CPCLKO, temporarily output from GA, to GA |
| CLRZ | I | clear signal |
| ENMEMZ | O | signal for activating CPU address under condition of 1MB or less except for ISA refresh mode |
| TESTMIZ | O | test signal; read test signal for write-only register |
| TSTCCZ | I | test signal; used for testing VLADS delay circuit |
| BLKEST | I | test signal |
| VLCSCMDG | O | used for controlling external output signal VLCSIZ |
| KAZ | O | next address |

The CPU controller 29 has a terminal for inputting a CPU clock signal (CPCLKO) generated inside the gate array, and a terminal for receiving a CPU clock signal (CPCLKI) which is obtained by re-inputting the signal CPCLKO, temporarily output from the gate array, to the gate array.

The DRAM controller 31 is a block for controlling the DRAM 7 shown in FIG. 1, and the input/output signals of this block are as follows.

| Signal Name | I/O | Function |
|---|---|---|
| LAD26-03 | I | CPU/VL address (latch) |
| A021 | I | CPU/VL address (latch) |
| BE7Z-0Z | I | CPU byte enable (latch) |
| ADSZ | I | CPU address strobe |
| MIOJ | I | CPU memory/IO (latch) |
| WR | I | CPU write/read |
| PCD | I | page cache disable |
| LOCKZ | I | lock |
| CACHEZ | I | cache |
| AHOLD | O | address hold |
| EADSZ | O | external address strobe |
| KENZ | O | cache enable |
| INV | O | invalid |
| BRDYZ | O | CPU ready |
| HLDA | O | hold acknowledge |
| VBE31Z-01Z | I | VL bus byte enable |
| VRDYOOZ | O | VL bus ready |
| VRDYIZ | I | VL bus ready (return) |
| VHOLDA | O | VL bus hold acknowledge |
| DRAMCYC | I | DRAM cycle |
| DRAMWP | I | DRAM write protect |
| DRAMKNZ | I | DRAM cache enable |
| DRAMWB | I | write back/write through |
| ARADEF | I | area define |
| MA26-14 | I | logical memory address |
| RAS5Z-0Z | O | RAS |
| CAS7Z-0Z | O | internal CAS |
| MWEZ | O | internal WE |
| MADR11-00 | O | memory address |
| ECAS3Z-0Z | O | expansion CAS |
| EMWEZ | O | expansion WE |
| MEMWZ | I | ISA memory write |
| MEMRZ | I | ISA memory read |
| D64HIT | O | indicating that internal 64-bit memory hit has occurred |
| DRAMRF | I | shadow refresh timing signal |
| SA01-00 | I | ISA addresses 01, 00 |
| MSTRZ | I | master signal |
| IOWTZ | I | ISA IO write |
| IORDZ | I | ISA IO read |
| SD071-001 | I | internal register write data |
| REGD07-00 | O | internal register read data |
| REGSL | O | internal register select |
| CPCLKI | I | CPU clock (return) |
| CPCLKO | I | CPU clock (output) |
| VLCLKI | I | VL bus clock |
| CLK16M | I | 16-MHz clock |
| RFCLK | I | 32-kHz clock |
| DSEL0 | O | data (D63-32/D31-0) |
| VDLAT0 | O | VL data lower DWORD latch |
| VLDAT1 | O | VL data upper DWORD latch |
| CLRZ | I | PCLR# + RCLR# |
| DRAMTSZ | I | test mode signal |
| MCPCLK | I | CPU clock used in master mode |
| WBWT | O | write back/write through |
| PCLRZ | I | power-ON clear signal |
| HITMZ | I | signal HITM# input from CPU |
| EXM32SL | I | inverted signal of EM64SL |
| DCNAZ | O | next address (indicating that external memory is prepared for pipeline cycle) |

The DRAM controller 31 has a terminal for receiving a CPU clock signal (CPCLKO) generated inside the gate array, and a terminal for receiving a CPU clock (CPCLKI) which is obtained by re-inputting the signal CPCLKO, temporarily output from the gate array, to the gate array.

The input/output signals of the CPU cycle controller 33 are as follows.

| Signal Name | I/O | Function |
|---|---|---|
| LAD26-03 | I | CPU/VL address (latch) |
| ADSZ | I | CPU address strobe |
| DC | I | P54C (Pentium) data command |
| MIOJ | I | CPU memory/IO (latch) |
| BRDYZ | I | CPU ready |
| WR | I | CPU write/read |
| CACHEZ | I | cache |
| KENZ | I | cache enable |
| IORDZ | I | ISA IO read |
| IOWTZ | I | ISA IO write |
| RFCLK | I | 32-kHz clock |
| REGD07-00 | O | internal register read data |
| REGSL | O | internal register select |
| SA01,00 | I | ISA addresses 01, 00 |
| SD071-001 | I | internal register write data |
| TESTMIZ | I | test signal; read test signal of write-only register |
| TESTB1Z | I | test mode |
| TESTB2Z | I | test mode |
| CPCLKI | I | signal obtained by re-inputting CPCLKO, temporarily output from G.A., to G.A. |
| CPCLKO | I | CPU clock signal |
| CLRO | I | clear signal |
| HLDA | I | hold permission from P54C |

The CPU cycle controller 33 has a terminal for receiving the signal CPCLKI.

A selector 35 receives a CPU clock signal (CPCLKO) from the frequency divider 25, and a CPU clock signal (CPCLKI) which is obtained by re-inputting the signal CPCLKO, temporarily output from the gate array, to the gate array, and outputs one of the input signals in accordance with a clock switching signal (XTESTI). More specifically, the signal XTESTI is a signal for selecting whether a signal CPCLKX to be supplied to the respective blocks 29, 31, and 33 is generated based on the internal clock (CPCLKO) or based on the clock (CPCLKI) returned from an external pin. When XTESTI=0, the selector 35 selects the signal CPCLKI, and when XTESTI=1, the selector 35 selects the signal CPCLKO. The generation of the clock switching signal (XTEST1) may be implemented by the execution of an IRT (Initial Reliability Test) routine. Alternatively, the XTEST1 may be fixedly generated by using a pull-up resistor or a pull-down resistor.

Figure 7:
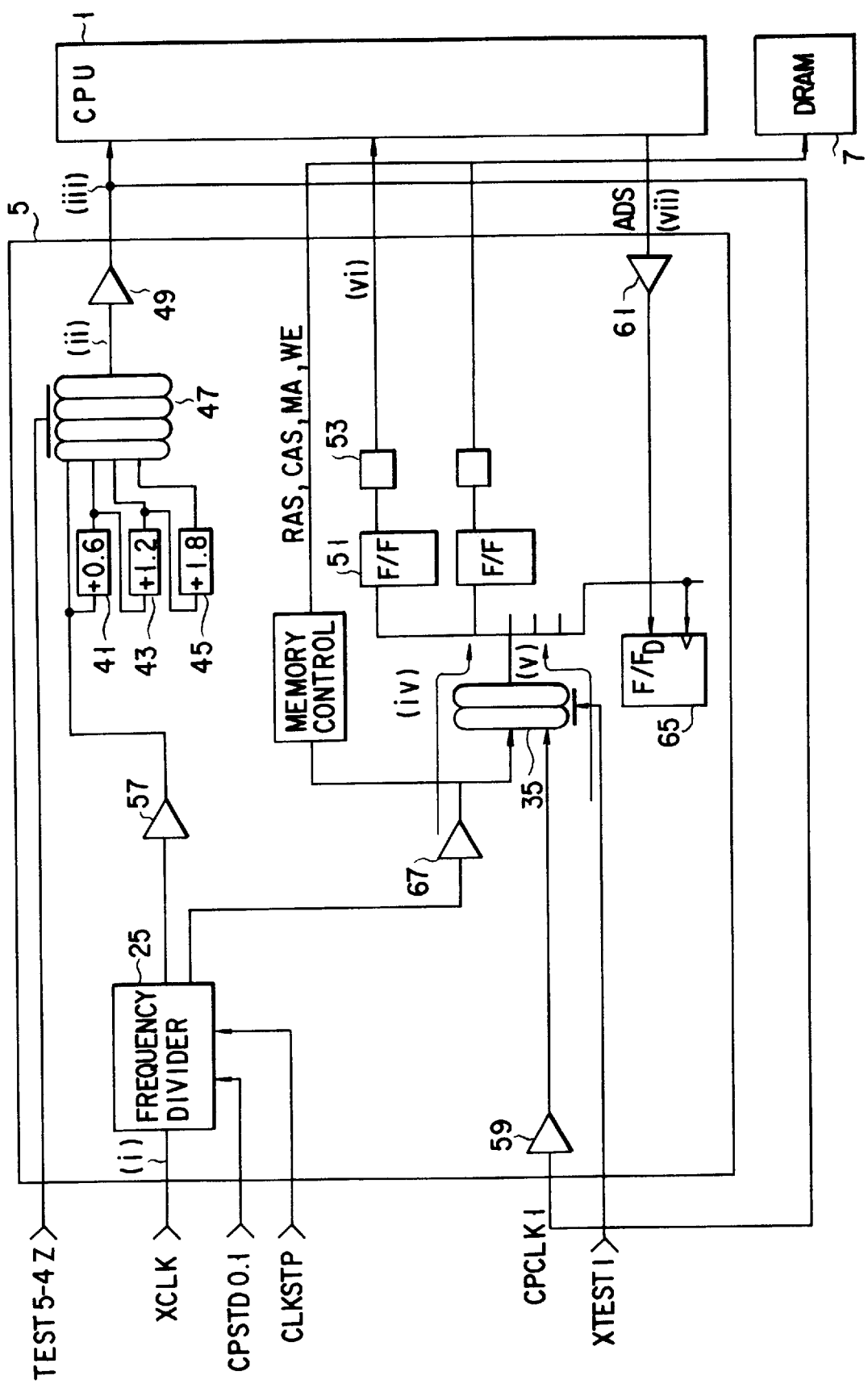
FIG. 7 is a detailed circuit diagram of the CPU control gate array shown in FIG. 6.

FIG. 7 is a detailed circuit diagram of the delay controller 27 shown in FIG. 6. As shown in FIG. 7, the delay controller 27 comprises delay elements 41, 43, and 45 for respectively delaying the default value of the CPU clock output from the frequency divider 25 by 0.6 ns, 1.2 ns, and 1.8 ns, a selector 47 for selecting and outputting one of "default value", "default value+0.6 ns", "default value+1.2 ns", and "default value+1.8 ns" in accordance with the delay switching signals TEST5-4Z, and an output buffer 49 for latching the output from the selector 47.

FIGS. 8A through 8F are timing charts of the respective units in FIG. 7. FIG. 8A shows the timing of the fundamental clock (XCLK) before being input to the frequency divider 25, FIG. 8B shows the timing of the output from the selector 47 in a normal mode (default value), FIG. 8C shows the timing of a clock output from the output buffer 49 to the CPU 1, FIG. 8D shows the timing of the CPU clock signal (CPCLKO) from the frequency divider 25, FIG. 8E shows the timing of the clock which has passed an F/F 51 and a circuit 53, and FIG. 8F shows the timing of a signal (e.g., a signal ADS) output from the CPU 1.

The delay time shown in FIG. 8B corresponds to one from the input of the frequency divider 25 to the output of the selector 47.

As shown in FIGS. 8C and 8D, the timing of a signal (iv) is adjusted to have the same clock skew as that of a signal (iii). As a result, the clock output to the CPU 1 theoretically has the same timing as that of the CPU clock signal (CPCLKO) generated in the gate array. Therefore, the clock to be output to the CPU 1 is synchronized with the operation clock in the CPU controller.

Assuming that a signal (vi) is generated based on the signal (iv), the signal (vi) is delayed by the delay time (e.g., 10 ns) of the F/F 51 and the circuit 53. The signal (vi) is sampled in synchronism with the clock (iii). In practice, the setup time is determined with respect to the clock (iii).

The same operation is performed when the CPU control gate array 5 outputs control signals (RAS, CAS, MA, WE, and the like) to the DRAM 7.

On the other hand, when signals (ADS, and the like) output from the CPU 1 are input, the CUP control gate array 5 samples such signals in synchronism with the clock (iv).

Assuming that the delay time of the signal (vi) is 10 ns, as shown in FIG. 8E, if the CPU is operated at 66 MHz, one period requires 15 ns, and only a margin as small as 5 ns (=15 ns−10 ns) is obtained. For example, if the prescribed minimum setup time for the CPU is 3 ns, the remaining time is only 2 ns. However, since the calculated value is a theoretical value, the signal (iv) may be offset to the right or left along the time base. For example, if the signal is offset to the right by 2 ns, a delay time of 12 ns is required together with the delay time of 10 ns, and almost no setup time can be assured.

In order to solve this problem, according to the embodiment of the present invention, the clock to be output to the CPU 1 is delayed using the delay controller. More specifically, the clock to be output to the CPU 1 is delayed by the delay elements 41, 43, and 45 shown in FIG. 7, and the delay switching signals (TEST5-4Z) are supplied to the selector 47 to output the CPU clock delayed by a desired value. As a result, the time from the leading edge of the clock (iii) shown in FIG. 8C to the output of the signal (vi) shown in FIG. 8E is apparently shortened, and a larger margin can be assured accordingly.

For example, if the delay time from the leading edge of the signal (iv) shown in FIG. 8D to the output of the signal (vi) shown in FIG. 8E is 10 ns, and the clock skew between the signal (iii) in FIG. 8C and the signal (iv) in FIG. 8D is 0 ns, the setup time of the signal (vi) with respect to the clock (iii) is 5 ns (=15 ns−10 ns). Assuming that the signal (iv) is delayed by 2 ns with respect to the signal (iii), the delay time from the signal (iv) to the signal (vi) becomes 12 ns, and the setup time becomes 3 ns (=15 ns−12 ns). For this reason, by apparently delaying the clock (iii) with respect to the signal (iv), the delay time is added to the setup time, and a larger margin can be assured.

The clock obtained by re-inputting the CPU clock will be described below.

The above-mentioned delicate clock switching operation cannot be dynamically attained. More specifically, an operation error may occur unless the power supply is turned on after the clock is switched using an external pin. When the clock is programmably dynamically switched, a jitter may be generated. More specifically, when clock signals delayed by three different delay times, as shown in FIGS. 9A through 9C, are to be switched, they must be switched when all the clocks shown in FIGS. 9A through 9C are at low level, so as to prevent generation of the jitter. For this purpose, a signal shown in FIG. 9D must be generated as the switching timing signal. Even when the switching timing signal shown in FIG. 9D is generated, the clock period may instantaneously change upon switching. For example, when a clock a is switched to clock b, the original clock period is 15 ns, but this particular cycle requires a period of 15 ns+1 ns. As for the jitter of the CPU clock, an allowable value is determined in advance, and the delay time must be changed so that the jitter falls within the range of the allowable value.

In this case, if a delay time of about 1 to 2 ns is to be generated using about four or five different clocks, the jitter falls outside the range of the allowable value.

On the other hand, the CPU clock is switched dynamically. The switching principle in this case is the same as that described above. For example, assuming that three clocks are to be switched, as shown in FIGS. 10A through 10C, the switching timing free from any jitter must be set when all the clocks are at low level. Of course, a problem of a change in period is posed in this case. However, as can be seen from FIGS. 10C and 10D, this switching timing signal is generated once per period of the most delayed clock (FIG. 10C in this example). In this case, the period may change since the clock must be switched. Therefore, the CPU clock is switched dynamically.

On the other hand, the reason why the CPU clock output from the CPU control gate array is re-input to the CPU control gate array is as follows.

Assume that a clock CPCLKO (iv) is delayed with respect to a clock (iii) to be output to the CPU 1, as shown in FIGS. 11A through 11D. On the other hand, a signal output from the CPU shown in FIG. 11C includes a signal which is output to have a minimum delay time of 0.5 ns or 0 ns with respect to the clock (iii). If the CPU inputs a signal to the CPU control gate array to have a minimum delay time of 0 ns with respect to the clock (iii), the signal is actually input to have a delay time of about 1 ns since it is input via a buffer 61. In this case, when the signal output from the CPU is to be sampled using a clock (iv) shown in FIG. 11B, since the clock (iv) is offset to the right or left along the time base with respect to the clock (iii), as described above, if the signal is input to the CPU control gate array to have a minimum delay time of 0 ns, the signal is undesirably synchronized with the timing of the clock (iv), and the signal from the CPU cannot be sampled. Therefore, the clock (iv) must be located at the same timing position as that of the clock (iii) or at a timing position within the delay time generated by the buffer 61.

However, as described above, it cannot be determined if the clock (iv) leads or lags behind the clock (iii).

In this case, the clock (iv) is switched to a clock (v) shown in FIG. 11D. The clock (v) is in phase with the clock (iii) outside the CPU control gate array. In addition, when the clock (iii) is input to the CPU control gate array, since it is delayed by a buffer 59, the phase of the clock (v) is locked with or is delayed from that of the clock (iii). The delay time of the clock (v) generated by the buffer 59 is canceled by the delay time of the CPU output signal generated by the buffer 61. As a result, if the clock (v) is used, the CPU output signal can be reliably sampled.

Although the signals (iii) and (iv) are synchronized in calculation, their actual relationship is indefinite. More specifically, upon reception of signals supplied from the CPU in an actual product, whether or not these signals satisfy a prescribed setup time can only be determined in calculation or upon evaluation using an actual machine. Strictly speaking, the CPU and the CPU control gate array operate using different clocks, i.e., asynchronously. In this case, if the CPU operates at a speed as high as 15 ns per period, it is very difficult to accurately detect the delay time and the setup time. In the simplest method, a synchronous circuit is realized by operating the internal circuits of the CPU control gate array in synchronism with a clock synchronized with the CPU clock.

Figure 12:
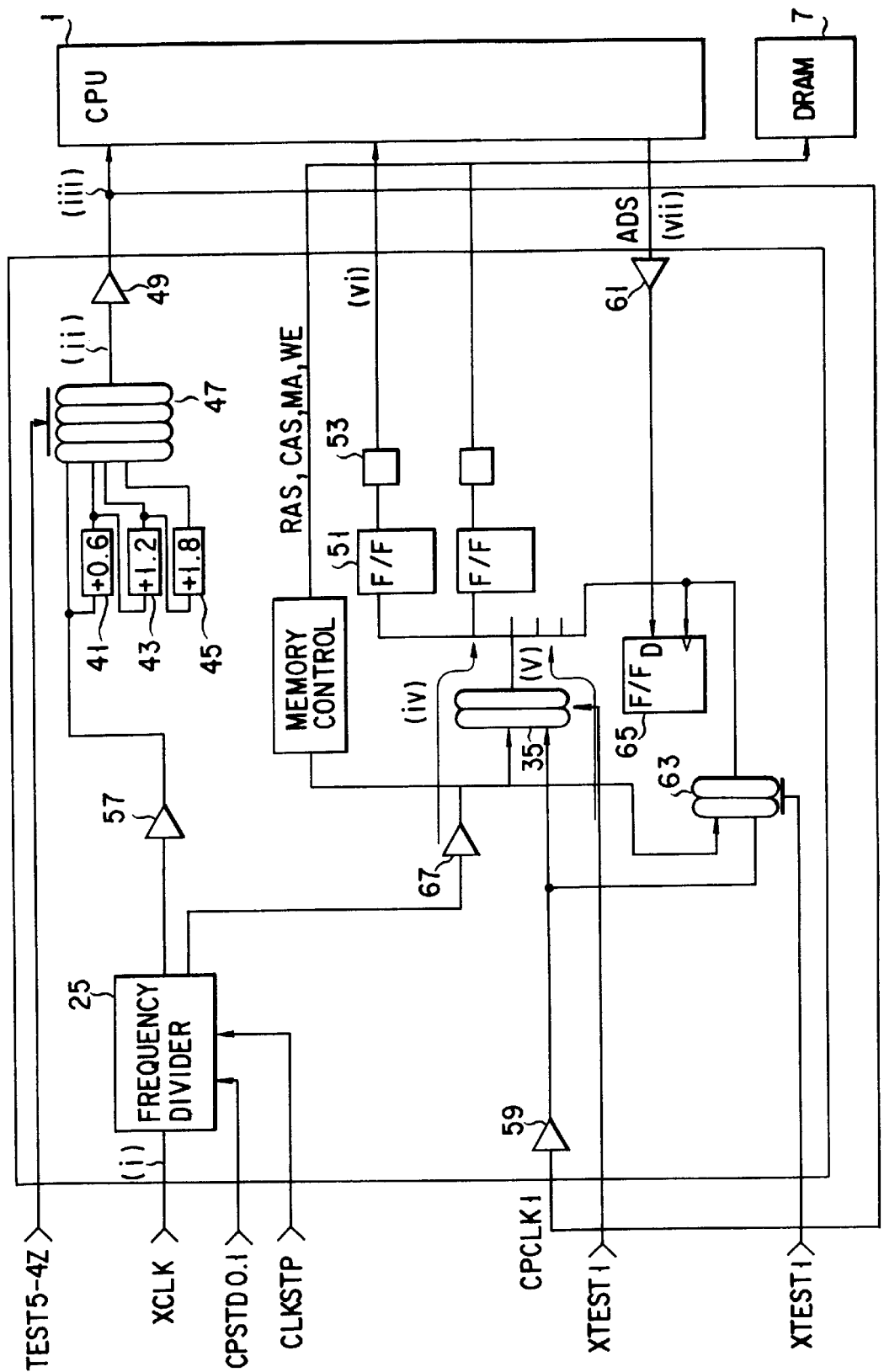
FIG. 12 is a block diagram showing the first modification of the embodiment shown in FIG. 7.

Note that a circuit which receives a signal from the CPU must be a synchronous circuit. For this purpose, a clock obtained by re-inputting the CPU clock is used. However, other internal circuits are required to operate at higher-speed clocks. However, if the clock obtained by re-inputting the CPU clock is used in this case, the clock has a delay. For this reason, as shown in FIG. 12, a selector 63 is arranged. When a signal from the CPU 1 is to be received, the selector 63 selects the clock obtained by re-inputting the clock (iii) and supplies it to an F/F 65. On the other hand, the selector 35 selects an internally generated clock (clock (iv)) and supplies it to other circuits, e.g., the F/F 51, thus allowing higher-speed processing. In order to attain still higher-speed processing (e.g., to output control signals such as RAS, CAS, MA, WE, and the like to the DRAM 7 in FIGS. 7, 12, and 13), the output from a buffer 67 may be directly supplied to the circuits such as the F/F 51 without going through the selector 35.

On the other hand, as shown in FIG. 13, a register 69 may be arranged, so as to programmably set the delay value of the CPU clock.

According to the above-mentioned circuit arrangement, the clock can be switched to either a clock internally generated based on the fundamental clock (XCLK) or a clock obtained by re-inputting the clock, which is temporarily output to an external circuit. Therefore, as a clock for generating a signal to be output to the CPU, the DRAM, or the like, the clock CPCLKO is used, and as a clock for sampling an input signal from the CPU, the clock CPCLKI is used, so that a signal synchronized with the CPU clock can be output to the CPU and the DRAM. On the other hand, the input signal from the CPU can be input in synchronism with the internal operation clock of the gate array 5 since the clock signal obtained by re-inputting the clock CPCLKO, which is temporarily output from the gate array, is used. For this reason, the need for skew adjustment can be suppressed as much as possible, and the delay times of various signals can be minimized, thus allowing high-speed processing.

Furthermore, since only the clock to be output to the CPU can be delayed with respect to the clock used for generating a DRAM control signal, the delay time of the DRAM control signal with respect to the CPU clock can be minimized, thus shortening the access time accordingly.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A computer system, comprising:

a central processing unit (CPU);

a memory circuit;

a system controller for controlling the CPU;

first clock generating means for generating a basic clock signal;

second clock generating means for generating a CPU clock signal and a circuit clock signal for generating a signal for each circuit within the system controller in accordance with the basic clock signal;

means for outputting, from the system controller to the CPU, the CPU clock signal generated by the second clock generating means;

means for feeding back the CPU clock signal output to the CPU to the system controller;

means for outputting the signal, when a signal is to be output from the system controller to the memory circuit, to the memory circuit in synchronism with the circuit clock signal for generating the signal for each said circuit within the system controller; and means for operating each said circuit within the system controller, when a signal is to be output from the CPU to the system controller, by using the fed-back CPU clock signal.

2. The system according to claim 1, further comprising means for delaying the CPU clock signal with respect to the circuit clock signal for generating a signal for each said circuit within the system controller output from the second clock generating means.

3. The system according to claim 2, further comprising means for setting the delay means programmably.

4. A computer system, comprising:

a central processing unit (CPU);

a memory circuit;

a system controller for controlling the CPU;

first clock generating means for generating a basic clock signal;

second clock generating means for generating a CPU clock signal and a circuit clock signal for generating a signal for each circuit within the system controller in accordance with the basic clock signal;

means for outputting, from the system controller to the CPU, the CPU clock signal generated by the second clock generating means;

means for feeding back the CPU clock signal output to the CPU to the system controller;

means for outputting the signal, when a signal is to be output from the system controller to the memory circuit, to the memory circuit in synchronism with the circuit clock signal for generating the signal for each said circuit within the system controller; and means for operating each said circuit within the system controller, when the system controller samples the signal output from the CPU, by using the fed-back CPU clock signal.

5. The system according to claim 4, further comprising means for delaying the CPU clock signal with respect to the circuit clock signal for generating a signal for each said circuit within the system controller output from the second clock generating means.

6. The system according to claim 5, further comprising means for setting the delay means programmably.

7. A computer system, comprising:

a central processing unit (CPU);

a system controller for controlling the CPU;

first clock generating means for generating a basic clock signal;

second clock generating means for generating a CPU clock signal to be output to the CPU and a circuit clock signal for generating a signal for each circuit within the system controller, in accordance with the basic clock signal;

means for outputting, from the system controller to the CPU, the CPU clock signal generated by the second clock generating means;

means for feeding back to the system controller the CPU clock signal output to the CPU;

means for generating a selection signal; and means, coupled to the first clock generating means and the feed back means, for inputting the circuit clock signal for generating signals of each circuit within the system controller and the fed-back CPU clock signals, and for, when each said circuit within the system controller is to be operated, outputting, in accordance with the selection signal from the selection signal generating means, the circuit clock signal for generating a signal for each said circuit within the system controller or the fed-back CPU clock signal, as the circuit clock signal for generating a signal for each said circuit within the system controller.

8. The system according to claim 7, further comprising means for delaying the CPU clock signal with respect to the circuit clock signal for generating a signal for each said circuit within the system controller.

9. The system according to claim 8, further comprising means for setting a delay amount by the delay means programmably.

10. A computer system, comprising:

a central processing unit (CPU);

a memory circuit;

a system controller for controlling the CPU;

first clock generating means for generating a basic clock signal;

second clock generating means for generating a CPU clock signal output to the CPU and a circuit clock signal for generating a signal for each circuit within the system controller, in accordance with the basic clock signal;

means for outputting the CPU clock signal generated by the second clock generating means from the system controller to the CPU;

means for feeding back the CPU clock signal output to the CPU to the system controller;

means for outputting the signal, when a signal is to be output to the memory circuit from the system controller, to the memory circuit in synchronism with the circuit clock signal for generating a signal for each said circuit within the system controller; and means, coupled to the first clock generating means and the feed back means, for inputting the circuit clock signal for generating a signal for each said circuit within the system controller output from the second clock generating means and the fed-back CPU clock signal, for selecting the fed-back CPU clock signal when a signal output from the CPU is sampled, and for selecting the circuit clock signal for generating a signal for each said circuit within the system controller when the signal to be output to the CPU is to be generated.

11. The system according to claim 10, further comprising means for setting a delay amount by the delay means programmably.

12. A computer system, comprising:

a circuit;

a controller for controlling the circuit;

first clock generating means for generating basic clock signals;

second clock generating means for generating a circuit clock signal and a clock signal for generating a signal for a circuit within the system controller in accordance with the basic clock signals;

means for outputting, from the controller to the circuit, the circuit clock signal generated by the second clock generating means;

means for feeding back the circuit clock signal from the circuit to the controller; and means, when a signal is to be output from the circuit to the controller, for operating a second circuit within the system controller by using the fed-back circuit clock signal.

13. The system according to claim 12, further comprising means, when a signal is to be output from the controller to the circuit, for outputting the signal to the circuit in synchronism with the clock signal for generating the signal for the second circuit.

14. The system according to claim 13, further comprising means for delaying the circuit clock signal with respect to the clock signal for generating the signal for the second circuit from the second clock generating means.

15. The system according to claim 14, further comprising means for programmably setting the delay means.

* * * * *